United States Patent
Lee et al.

(10) Patent No.: US 7,381,987 B2
(45) Date of Patent: Jun. 3, 2008

(54) DRIVING CIRCUIT FOR DISPLAY DEVICE

(75) Inventors: Jong-Hwan Lee, Anyang-si (KR);
Sung-Man Kim, Seoul (KR);
Hyang-Shik Kong, Suwon-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 11/206,541

(22) Filed: Aug. 18, 2005

(65) Prior Publication Data

US 2006/0038500 A1   Feb. 23, 2006

(30) Foreign Application Priority Data

Aug. 19, 2004 (KR) .................. 10-2004-0065390

(51) Int. Cl.
*H01L 29/04* (2006.01)
*H01L 27/14* (2006.01)
*G09G 5/00* (2006.01)

(52) U.S. Cl. ................... 257/57; 257/72; 345/205
(58) Field of Classification Search ................ 345/204, 345/690, 211, 212, 205; 257/52, 57, 72, 257/103

See application file for complete search history.

(56) References Cited

U.S. PATENT DOCUMENTS

| 4,770,498 A | * | 9/1988 | Aoki et al. | .................... 349/47 |
| 5,812,284 A | * | 9/1998 | Mizutani et al. | ............ 358/482 |
| 5,966,787 A | * | 10/1999 | Nakayama et al. | ........ 29/25.35 |
| 6,144,466 A | * | 11/2000 | Mizutani et al. | ............ 358/482 |
| 6,563,174 B2 | * | 5/2003 | Kawasaki et al. | .......... 257/350 |
| 6,756,816 B2 | * | 6/2004 | Miyake | ....................... 326/83 |

FOREIGN PATENT DOCUMENTS

CN           1405898           3/2003

* cited by examiner

*Primary Examiner*—Thuy Vinh Tran
(74) *Attorney, Agent, or Firm*—Cantor Colburn LLP

(57) ABSTRACT

A driving circuit for a display device including a plurality of stages connected to each other and sequentially generating output signals, wherein each of the stages comprises a plurality of transistors, wherein each of the transistors comprises: a control electrode; a first insulating layer formed on the control electrode; a semiconductor layer formed on the first insulating layer; an input electrode, at least a portion of which formed on the semiconductor layer; an output electrode, at least a portion of which formed on the semiconductor layer; and a second insulating layer formed on the input and output electrodes, wherein a thickness ratio of the semiconductor layer to the first insulating layer ranges from 0.3 to 1.5.

11 Claims, 14 Drawing Sheets

FIG. 11

| Transistors | Gate Voltage | | Drain Voltage | Voltage difference of gate and drain | High Voltage ratio for a frame | Variation amount of threshold Voltage |
|---|---|---|---|---|---|---|
| | High | Low | | | | |
| T1,T14 | 2 Vgh | Vgl | Vgh | Vgh | 0.001 | 7.4 |
| T2 | Vgh | Vgl | Vgl | Vgh-Vgl | 0.001 | 7.7 |
| T3 | Vgh-Vth | Vgl | Vgl | Vgh-Vgl-Vth | 0.5 | 13.7 |
| T4 | Vgh | Vgl | Vgh | 0 | 0.001 | 5.4 |
| T5 | Vgh | Vgl | Vgl | Vgh-Vgl | 0.5 | 16.7 |
| T6 | Vgh | Vgl | Vgl | Vgh-Vgl | 0.001 | 8.3 |
| T7 | 1.5 Vgh | Vgl | Vgh | 0.5 Vgh | 0.5 | 9.3 |
| T8 | Vgh | Vgl | Vgl | Vgh-Vgl | 0.001 | 6.5 |
| T9 | Vgh | Vgl | Vgl | Vgh-Vgl | 0.001 | 6.6 |
| T10 | Vgh | Vgl | Vgl | Vgh-Vgl | 0.5 | 19.8 |
| T11 | Vgh | Vgl | Vgl | Vgh-Vgl | 0.5 | 20.5 |
| T12 | Vgh | Vgl | Vgh | 0 | 0.5 | 6.0 |
| T13 | Vgh | Vgl | Vgl | Vgh-Vgl | 0.001 | 4.4 |
| Q | Vgh | Vgl | – | Vgh | 0.001 | 1.8 |

DRIVING CIRCUIT FOR DISPLAY DEVICE

BACKGROUND OF THE INVENTION (a) Field of the Invention

The present invention relates to a driving circuit for a display device.

(b) Description of Related Art

In recent years, flat panel displays such as organic light emitting diode ("OLED") displays, plasma display panels ("PDPs") and liquid crystal displays ("LCDs") have been widely developed for use instead of heavy and large cathode ray tubes ("CRTs").

The PDP devices display characters or images using plasma generated by a gas discharge. The OLED display devices display characters or images by applying an electric field to specific light emitting organic or high molecule materials. The LCD devices display images by applying an electric field to a liquid crystal layer disposed between two panels and regulating the strength of the electric field to adjust transmittance of light passing through the liquid crystal layer.

Among the flat panel displays, as examples, the LCD and the OLED devices each include a panel assembly provided with pixels including switching elements and display signal lines. The LCD and the OLED devices also include a gate driver, i.e., a shift register that provides a gate signal for gate lines of the display signal lines to turn the switching elements on and off.

The shift register is comprised of a plurality of stages. Each of the stages includes a plurality of transistors, which generate an output synchronized with a clock signal of a plurality of clock signals in response to outputs of a previous stage and a next stage.

The shift register is integrated in the panel assembly that is formed together with the switching elements. In this case, each of the transistors comprising the stage contains a semiconductor layer, which may be constructed of an amorphous silicon or poly-silicon material. For example, when the amorphous silicon is used for the semiconductor layer, an ohmic contact layer and a drain electrode or a source electrode are sequentially formed thereon, and a gate insulating layer and a gate electrode are sequentially formed thereunder. When a predetermined voltage is applied to the gate electrode, a formation in the semiconductor layer causes currents to flow from the drain electrode to the source electrode.

In some cases when the shift register operates for a long time, the conductivity of each of the transistors may deteriorate, and thereby the shift register does not operate well.

In detail, when the gate voltage is low, electron concentration decreases due to an increase of a dangling bond in the semiconductor layer, and when the gate voltage is high, the electron concentration decreases due to what is called a tunneling phenomenon in which the electrons move to the gate insulating layer below the semiconductor layer. This causes the voltage difference over the gate insulating layer to be increased and thus a threshold voltage to be increased. Accordingly, a decrease of a drain voltage, which is proportional to the square of the difference between a gate-source voltage and the threshold voltage, does not generate a required output and causes the shift register to not operate well.

SUMMARY OF THE INVENTION

Disclosed herein is a driving circuit of a display device capable of alleviating such conventional problems.

A driving circuit for a display device including a plurality of stages connected to each other and sequentially generating output signals is provided, wherein each of the stages comprises a plurality of transistors, wherein each of the transistors may include: a control electrode; a first insulating layer formed on the control electrode; a semiconductor layer formed on the first insulating layer; an input electrode, at least a portion of which is formed on the semiconductor layer; an output electrode, at least a portion of which is formed on the semiconductor layer; and a second insulating layer formed on the input and output electrodes, wherein a thickness ratio of the semiconductor layer to the first insulating layer ranges from 0.3 to 1.5.

A dielectric ratio of the semiconductor layer to the first insulating layer may be smaller than 1.

A relation of a voltage Vi over the first insulating layer and a voltage Vg applied to the control electrode preferably satisfies $$V_i(t) = V_g\left[1 - \frac{C_i}{C_{Si} + C_i}\exp\left(-\frac{t}{\tau}\right)\right], \tau = (C_{Si} + C_i)\left(\frac{1}{R_{Si}} + \frac{1}{R_i}\right)^{-1},$$

where Csi and Rsi are a capacitance and a resistance of the semiconductor layer, respectively, and Ci and Ri are respectively a capacitance and a resistance of the first insulating layer, and τ is a time constant.

Each of the transistors may further include an ohmic contact between the semiconductor layer and the input electrode or the semiconductor layer and the output electrode.

A capacitance ratio of the ohmic contact to the semiconductor layer is preferably larger than 0.5.

A relation of a voltage Vi over the first insulating layer and a voltage Vg applied to the control electrode preferably satisfies $$Vi(t) = V_g\left[1 - \frac{C_iC_{si} + C_iC_{ex}}{C_iC_{si} + C_{si}C_{ex} + C_iC_{ex}}\exp\left(\frac{-t}{\tau}\right)\right],$$

$$\tau = (C_i + C_{si} + C_{ex})\left(\frac{1}{R_i} + \frac{1}{R_{Si}} + \frac{1}{R_{ex}}\right)^{-1},$$

where Ci and Ri are a capacitance and a resistance of the first insulating layer, respectively, Csi and Rsi are a capacitance and a resistance of the semiconductor layer, respectively, Cex and Rex are a capacitance and a resistance of the ohmic contact, respectively, and τ is a time constant.

The voltage over the first insulating layer is preferably smaller than the voltage applied to the control electrode.

The semiconductor layer may comprise amorphous silicon.

The gate driver may be integrated on the display device.

BRIEF DESCRIPTION OF THE DRAWINGS

These and other features, aspects, and advantages of the present invention will become better understood when the following detailed description is read with reference to the accompanying figures, wherein:

FIG. 11 is a table that illustrates the relation of several voltages of the transistor shown in FIG. 4;

DETAILED DESCRIPTION OF THE INVENTION

Figure 1:
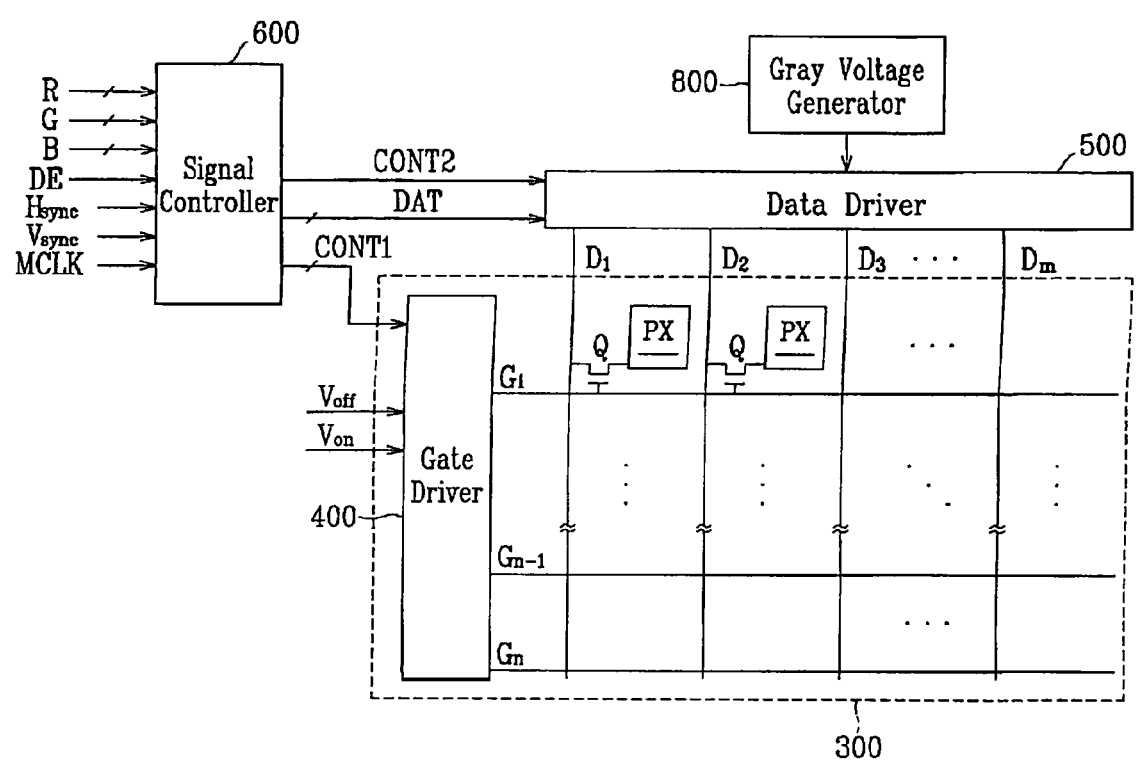
FIG. 1 is a block diagram of an exemplary embodiment of a display device according to present invention.

The present invention now will be described more fully hereinafter with reference to the accompanying drawings, in which exemplary embodiments of the invention are shown. This invention may, however, be embodied in many different forms and should not be construed as limited to the embodiments set forth herein.

In the drawings, the thickness of layers and regions are exaggerated for clarity and like numerals refer to like elements throughout. It will be understood that when an element such as a layer, film, region, substrate, or panel is referred to as being "on" another element, it can be directly on the other element or intervening elements may also be present. In contrast, when an element is referred to as being "directly on" another element, there are no intervening elements present.

Figure 2:
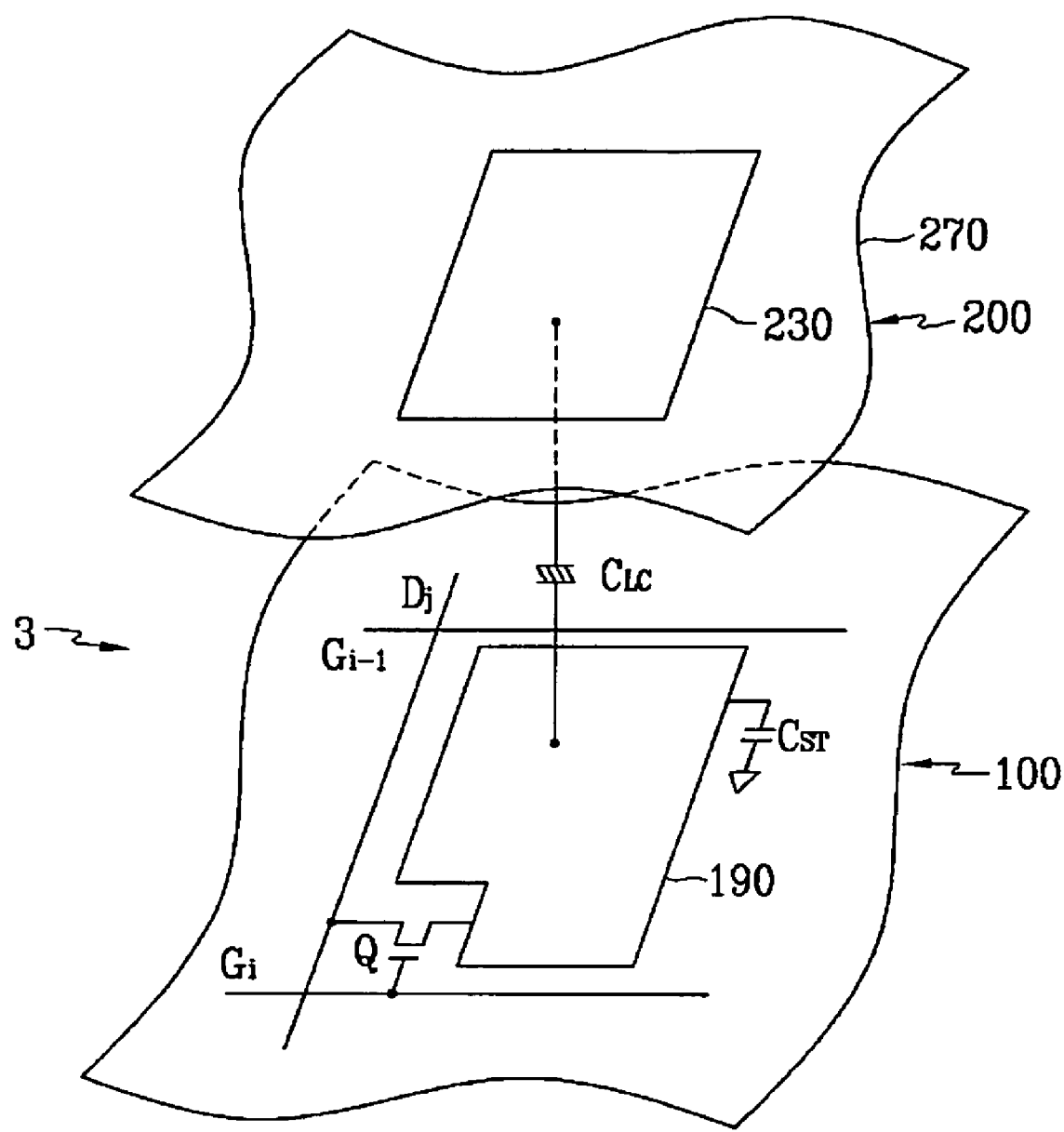
FIG. 2 illustrates an exemplary embodiment of a structure and an equivalent circuit diagram of a pixel of a liquid crystal display (LCD) according to the present invention.

FIG. 1, illustrates a block diagram of an exemplary embodiment of a display device, and FIG. 2 illustrates an exemplary embodiment of a structure and an equivalent circuit diagram of a pixel of an LCD.

Referring to FIG. 1, an exemplary embodiment of a display device includes a panel assembly 300, a gate driver 400 and a data driver 500 connected thereto, a gray voltage generator 800 connected to the data driver 500, and a signal controller 600 that controls the above-described elements.

The gate driver 400, the data driver 500, the signal controller 600, and the gray voltage generator 800 may be discrete devices as depicted in FIG. 1 or they may be combined into one or more The panel assembly 300 includes a plurality of display signal lines $G_1$-$G_n$ and $D_1$-$D_m$. The panel assembly also includes a plurality of pixels connected to the display signal lines $G_1$-$G_n$ and $D_1$-$D_m$. In an exemplary embodiment the pixels may be arranged substantially in a matrix structure. The panel assembly 300 includes a lower panel 100 and an upper panel 200.

Turning now to FIG. 2, the display signal lines $G_1$-$G_n$ and $D_1$-$D_m$ are provided on the lower panel 100 and include gate lines $G_1$-$G_n$ which may be used for transmitting gate signals (called scanning signals) and data lines $D_1$-$D_m$ which may be used for transmitting data signals. The gate lines $G_1$-$G_n$ extend substantially in a row direction and are substantially parallel to each other. Likewise, the data lines $D_1$-$D_m$ extend substantially in a column direction and are substantially parallel to each other.

In an exemplary embodiment, each pixel includes a switching element Q that is connected to: one of the gate lines $G_1$-$G_n$; one of the data lines $D_1$-$D_m$; and a pixel circuit PX. The switching element Q is provided on the lower panel 100 and includes three terminals: a control terminal that is connected to one of the gate lines $G_1$-$G_n$; an input terminal that is connected to one of the data lines $D_1$-$D_m$; and an output terminal that is connected to the pixel circuit PX.

In active matrix LCD devices, the panel assembly 300 includes the lower panel 100, the upper panel 200, and a liquid crystal (LC) layer 3 disposed between the lower and upper panels 100 and 200. The display signal lines $G_1$-$G_n$ and $D_1$-$D_m$ and the switching elements Q are provided on the lower panel 100. Each pixel circuit PX includes an LC capacitor $C_{LC}$ and a storage capacitor $C_{ST}$ that may be connected in parallel with the switching element Q. In an alternative exemplary embodiment, the storage capacitor $C_{ST}$ may be omitted.

The LC capacitor $C_{LC}$ is comprised of a pixel electrode 190 on the lower panel 100, a common electrode 270 on the upper panel 200, and the LC layer 3 as a dielectric between the pixel and common electrodes 190 and 270. The pixel electrode 190 is connected to the switching element Q. The common electrode 270 may cover the entire surface of the upper panel 200 and be supplied with a common voltage. In an alternative exemplary embodiment, both the pixel electrode 190 and the common electrode 270 may be shaped as bars or stripes and may be provided on the lower panel 100.

The storage capacitor $C_{ST}$ is an auxiliary capacitor for the LC capacitor $C_{LC}$. The storage capacitor $C_{ST}$ includes the pixel electrode 190 and a separate signal line (not shown), which is provided on the lower panel 100 and overlaps the pixel electrode 190 with an insulator disposed between the pixel electrode 190 and the separate signal line. The storage capacitor $C_{ST}$ is supplied with a predetermined voltage such as the common voltage. In an alternative exemplary embodiment, the storage capacitor $C_{ST}$ includes the pixel electrode 190 and an adjacent gate line called a previous gate line, which overlaps the pixel electrode 190 with an insulator disposed between the pixel electrode 190 and the previous gate line.

For a color display, each pixel uniquely represents one of three primary colors red, green, and blue. Either spatial division, which spatially represents the three primary colors, or temporal division, which sequentially represents the three primary colors in time, may be used to obtain a desired color. FIG. 2 illustrates an exemplary embodiment of the spatial division in which each pixel includes a color filter 230 representing one of the three primary colors in an area of the upper panel 200 facing the pixel electrode 190. In an alternative exemplary embodiment, the color filter 230 may be provided on or under the pixel electrode 190 on the lower panel 100.

In an exemplary embodiment, a pair of polarizers (not shown) for polarizing light are attached on outer surfaces of the lower and upper panels 100 and 200 of the panel assembly 300.

Returning now to FIG. 1, a gray voltage generator 800 generates one or two sets of gray voltages related to transmittance of the pixels. When two sets of gray voltages are generated, the gray voltages in one set have a positive polarity with respect to the common voltage, while the gray voltages in the other set have a negative polarity with respect to the common voltage. When one set of gray voltages are generated, the gray voltages may have either a positive polarity or a negative polarity with respect to the common voltage. In an exemplary embodiment, the gate driver 400 may be integrated on the panel assembly 300. The gate driver 400 synthesizes the gate-on voltage Von and the gate-off voltage Voff to generate gate signals for application to the gate lines $G_1$-$G_n$. The gate driver may be a shift register, and include a plurality of stages in a line. In an alternative exemplary embodiment, the gate drive 400 may be a discrete device connected to the panel assembly 300. The data driver 500 is connected to the data lines $D_1$-$D_m$ of the panel assembly 300 and applies data voltages selected from the gray voltages supplied from the gray voltage generator 800 to the data lines $D_1$-$D_m$. The data driver 500 may be integrated on the panel assembly 300 or may be a discrete device connected to the panel assembly 300. The signal controller 600 controls the gate driver 400 and the data driver 500.

Now, the operation of the display device will be described in further detail with reference to FIG. 1.

The signal controller 600 is supplied with image signals R, G, and B and input control signals for controlling the display of the image signals R, G, and B. The input control signals include, but are not limited to, a vertical synchronization signal Vsync, a horizontal synchronization signal Hsync, a main clock MCLK, and a data enable signal DE. The input control signals may be received from an external graphic controller (not shown). The signal controller 600 generates gate control signals CONT1 and data control signals CONT2 by processing the image signals R, G, and B to be suitable for the operation of the panel assembly 300. The signal controller 600 may generate the gate control signals CONT1 and data control signals CONT2 in response to the input control signals. Additionally, the signal controller 600 provides the gate control signals CONT1 to the gate driver 400, and the processed image signals DAT and the data control signals CONT2 to the data driver 500.

The gate control signals CONT1 include, but are not limited to, a vertical synchronization start signal STV for informing the gate driver of a start of a frame, a gate clock signal CPV for controlling an output time of the gate-on voltage Von, and an output enable signal OE for defining a width of the gate-on voltage Von. The data control signals CONT2 include, but are not limited to, a horizontal synchronization start signal STH for informing the data driver 500 of a start of a horizontal period, a load signal LOAD or TP for instructing the data driver 500 to apply the appropriate data voltages to the data lines $D_1$-$D_m$, and a data clock signal HCLK. The data control signals CONT2 may further include an inversion control signal RVS for reversing the polarity of the data voltages (with respect to the common voltage).

In an exemplary embodiment, the data driver 500 receives the processed image signals DAT for a pixel row from the signal controller 600 and converts the processed image signals DAT into data voltages. The data voltages are selected from the gray voltages supplied from the gray voltage generator 800 in response to the data control signals CONT2 from the signal controller 600. In response to the gate control signals CONT1 from the signal controller 600, the gate driver 400 applies the gate-on voltage Von to the gate lines $G_1$-$G_n$, which turns on the switching elements Q connected to the gate lines $G_1$-$G_n$.

The data driver 500 applies the data voltages to corresponding data lines $D_1$-$D_m$ for a turn-on time of the switching elements Q (which is called "one horizontal period" or "1H" and equals one period of the horizontal synchronization signal Hsync, the data enable signal DE, and the gate clock signal CPV). The data voltages in turn are supplied to corresponding pixels via the turned-on switching elements Q. The difference between the data voltage and the common voltage that is applied to a pixel is expressed as a charged voltage of the LC capacitor $C_{LC}$, i.e., a pixel voltage. The liquid crystal molecules have orientations depend on a magnitude of the pixel voltage, and the orientations determine a polarization of light passing through the LC capacitor $C_{LC}$. Additionally, the polarizers convert light polarization into light transmittance.

In an exemplary embodiment, by repeating the above described procedure, all gate lines $G_1$-$G_n$ are sequentially supplied with the gate-on voltage Von during a frame, thereby applying the data voltages to all pixels. In the LCD device shown in FIG. 1, when a next frame starts after finishing one frame, the inversion control signal RVS applied to the data driver 500 is controlled such that a polarity of the data voltages is reversed ("frame inversion"). In an alternative exemplary embodiment, the inversion control signal RVS may be controlled such that the polarity of the data voltages flowing in a data line in one frame is reversed (e.g.: "row inversion", "dot inversion"), or the polarity of the data voltages in one packet is reversed (e.g.: "column inversion", "dot inversion").

The gate driver 400 of an exemplary embodiment of a display device will be described more in detail with reference to FIGS. 3-15B.

Figure 3:
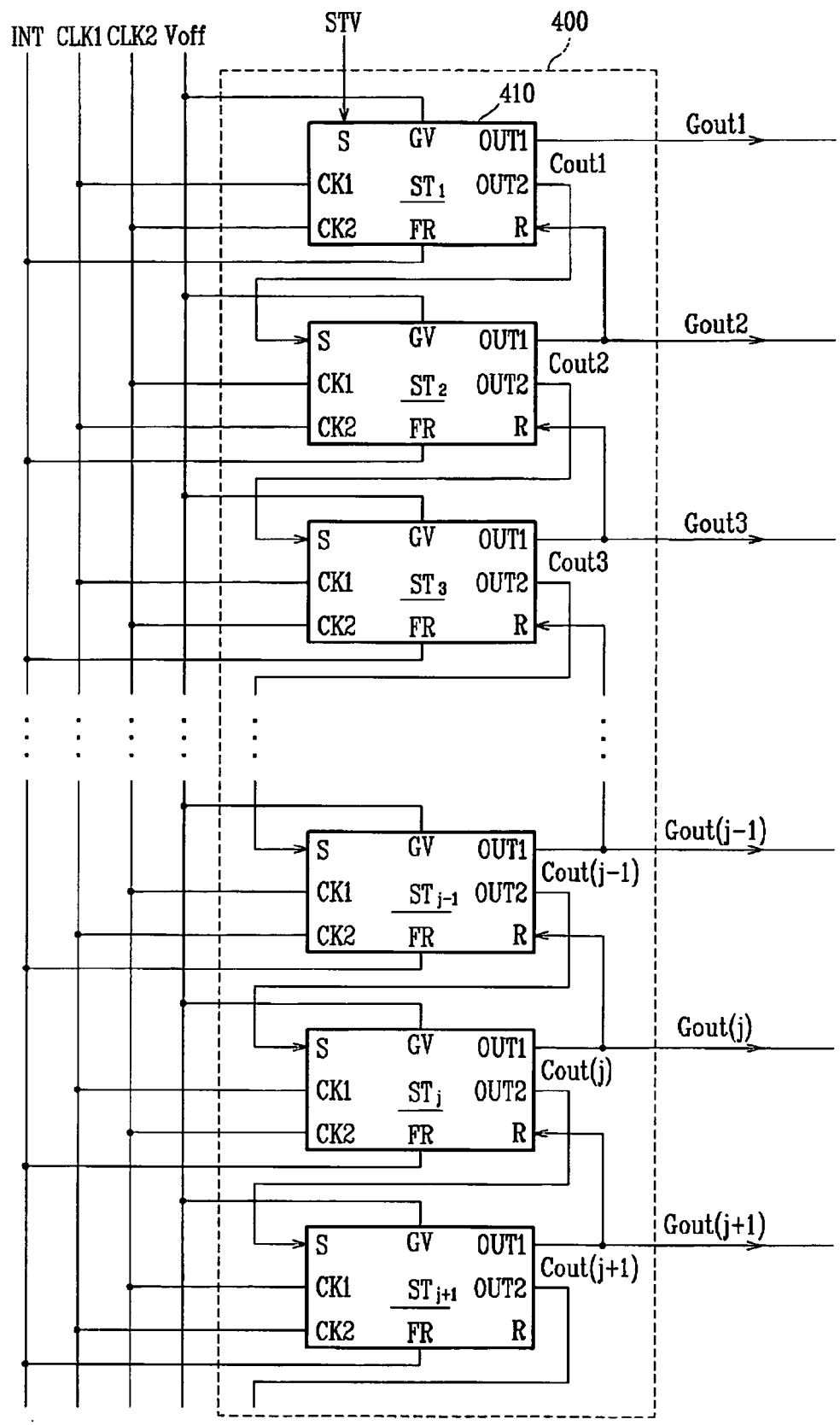
FIG. 3 is an exemplary embodiment a block diagram of a gate driver according to the present invention.
Figure 4:
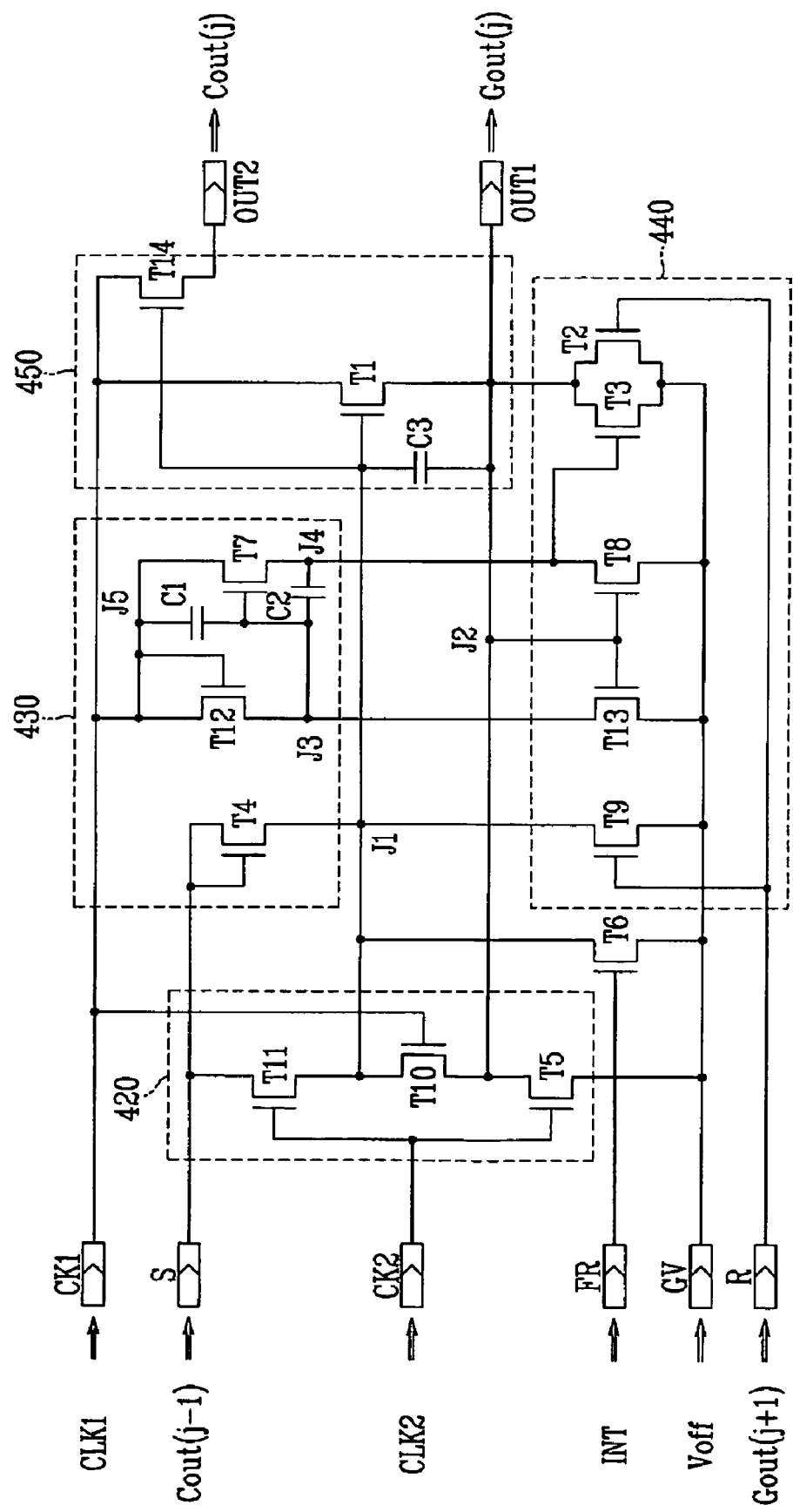
FIG. 4 is an exemplary circuit diagram of the j-th stage of the shift register for the gate driver shown in FIG. 3.
Figure 5:
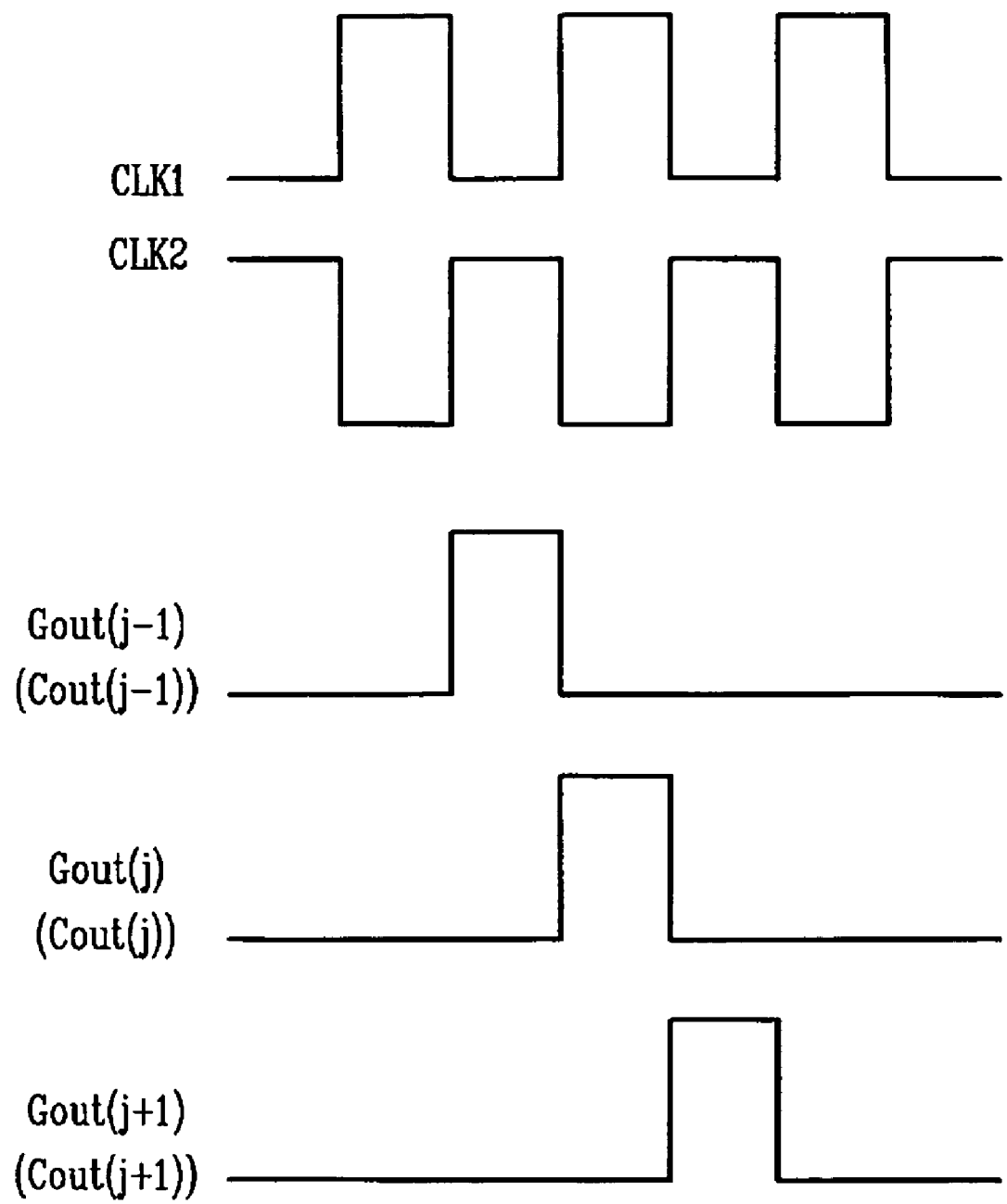
FIG. 5 shows waveforms of the gate driver shown in FIG. 3.

FIG. 3 illustrates an exemplary embodiment of a block diagram of a gate driver 400 according to the present invention, FIG. 4 illustrates an exemplary circuit diagram of j-th stage of a shift register for the gate driver 400 shown in FIG. 3, and FIG. 5 shows waveforms of signals of the gate driver 400 shown in FIG. 3.

Referring to FIG. 3, a gate driver 400 comprises a shift register including a plurality of stages 410 connected to the gate lines $G_1$-$G_n$. The gate driver 400 is supplied with a gate-off voltage $V_{off}$, clock signals CLK1 and CLK2, and an initializing signal INT. In an exemplary embodiment, the stages 410 of the gate driver 400 may be arranged in a line. Each of the stages 410 includes a set terminal S, a gate-off voltage terminal GV, a pair of clock terminals CK1 and CK2, a reset terminal R, a gate output terminal OUT1, and a carry output terminal OUT2. In each of the stages 410, for example, the set terminal S of the j-th stage $ST_j$ is supplied with a carry output of a previous stage $ST_{j-1}$, i.e., a previous carry output, and the reset terminal thereof is supplied with a gate output of a next stage $ST_{j+1}$, i.e., a next gate output Gout(j+1). The clock terminals CK1 and CK2 receive the clock signals CLK1 and CLK2, respectively, the gate voltage terminal GV receives the gate-off voltage $V_{off}$, and the frame reset terminal FR receives the initializing signal INT. The gate output terminal OUT1 outputs a gate output Gout(j) and the carry output terminal OUT2 outputs a carry output Cout(j). The S terminal of an initial stage $ST_1$ of the left shift register 400 is supplied with the vertical synchronization start signal STV instead of the previous gate output. Additionally, when the clock terminals CK1 and CK2 of the j-th stage receive the clock signal CLK1 and CLK2, respectively, the clock terminals CK1 of the (j−1)-th stage $ST_{j-1}$ and the (j+1)-th stage $ST_{j+1}$ receive the clock signal CLK2 and the clock terminals CK2 thereof receive the clock signal CLK1.

Figure 6:
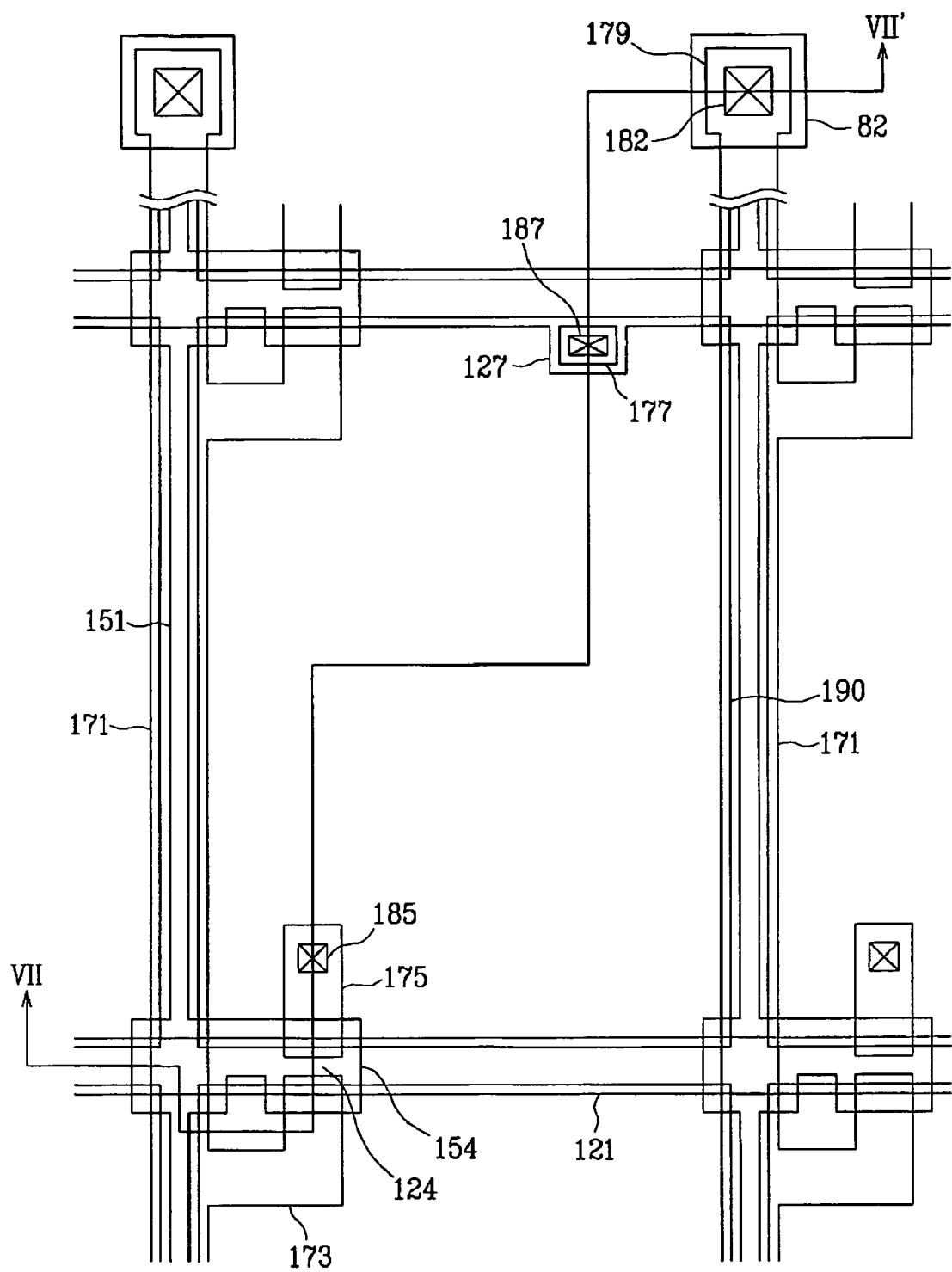
FIG. 6 is a layout view of an exemplary embodiment of a thin film transistor array panel for a display device.

In an exemplary embodiment, each clock signal CLK1 and CLK2 is the gate-on voltage $V_{on}$ for a high interval and is the gate-off voltage for a low interval in order to drive the switching elements Q of the pixels. However, it is also contemplated that the voltage level for the high interval and the low interval may be any suitable voltage. As shown in FIG. 6, the duty ratio and the phase difference of the clock signals CLK1 and CLK2 may be 50% and 180 degrees, respectively. It is also contemplated that the duty ratio and the phase difference of the clock signals CLK1 and CLK2 may be other suitable values.

Turning now to FIG. 4, one of the stages 410 of the gate driver 400 is depicted. The stage 410 includes an input unit 420, a pull-up driving unit 430, a pull-down driving unit 440, and an output unit 450. Each of the above-described units 420, 430, 440, and 450 includes at least an NMOS transistor, for example, T1-T14, which acts as an electrical conduction path between a drain and a source of each transistor controlled by an input at a gate of each transistor. The pull-up driving unit 430 and the output unit 450 further include capacitors C1-C3. It is contemplated that the NMOS transistors may be replaced by PMOS transistors or a combination of NMOS and PMOS transistors may be used and the capacitors C1-C3 may be parasitic capacitances between a gate and either a drain or a source formed during a manufacturing process.

In an exemplary embodiment, the input unit 420 includes three transistors T11, T10, and T5 connected in series between the set terminal S and the gate voltage terminal GV. Gates of the transistors T11 and T5 are connected to the clock terminal CK2, and the gate of the transistor T10 is connected to the clock terminal CK1. A point of contact between the transistor T11 and the transistor T10 is connected to a contact J1, and a point of contact between the transistor T10 and the transistor T5 is connected to a contact J2.

In an exemplary embodiment, the pull-up driving unit 430 includes a transistor T4 connected between the set terminal S and the contact J1, a transistor T12 connected between the clock terminal CK1 and a contact J3, and a transistor T7 connected between the clock terminal CK1 and a contact J4. The transistor T4 has a gate and a drain commonly connected to the set terminal S and a source connected to the contact J1, and the transistor T12 has a gate and a drain commonly connected to the clock terminal CK1 and a source connected to the contact J3. The transistor T7 has a gate connected to the contact J3 and also connected to the clock terminal CK1 via the capacitor C1, and a drain connected to the clock terminal CK1 and a source connected to the contact J4. The capacitor C2 is connected between the contact J3 and the contact J4.

In an exemplary embodiment, the pull-down driving unit 440 includes transistors T6, T9, T13, T8, T3, and T2 supplied with the gate-off voltage $V_{off}$ via sources thereof for output to the contacts J1-J4. The gate and drain of the transistor T9 are connected to the reset terminal R and the contact J1, respectively. Gates of the transistors T13 and T8 are commonly connected to the contact J2, and drains thereof are commonly connected to the contacts J3 and J4, respectively. The gate of the transistor T3 is connected to the contact J4, the gate of the transistor T2 is connected to the reset terminal R, and the drains of the transistors T3 and T2 are commonly connected to the contact J2. The gate, the drain, and the source of the transistor T6 are connected to the frame reset terminal FR, the contact J1, and the gate voltage terminal GV, respectively.

In an exemplary embodiment, the output unit 450 includes transistors T1 and T14 and the capacitor C3. Drains and sources of the transistors T1 and T14 are connected to the clock terminal CK1 and the output terminals OUT1 and OUT2 respectively, and gates thereof are connected to the contact J1. The capacitor C3 is connected between the gate and the drain of the transistor T1, i.e., the contact J1 and the contact J2. A source of the transistor T1 is also connected to the contact J2.

It is also contemplated that the units 420, 430, 440, and 450 of the stage 410 may be constructed in various arrangements with NMOS or PMOS transistors and the exemplary embodiments show are for illustration purposes only.

Turning now to FIGS. 4-6, an operation of a stage 410 will be described in further detail.

For descriptive convenience, a voltage corresponding to the high levels of the clock signals CLK1 and CLK2 is referred to as a high voltage, and a voltage corresponding to the low levels thereof has the same magnitude as the gate-off voltage $V_{off}$ and is referred to as a low voltage. It should be noted that the high and low voltage levels may be set to any suitable levels.

When the clock signal CLK2 and the previous gate output signal Gout(j−1) are high, the transistors T11 and T5 and the transistor T4 are turned on. Two transistors T11 and T4 transmit the high voltage to the contact J1 and the transistor T5 transmits the low voltage to the contact J2. Thus, the transistors T1 and T14 are turned on and thereby the clock signal CLK1 is transmitted to the output terminals OUT1 and OUT2. Since a voltage at the contact J2 and the clock signal CLK1 are low, the output voltages Gout(j) and Cout(j) are low. At the same time, the capacitor C3 charges a voltage of a magnitude corresponding to a difference of the high voltage and the low voltage. In this case, the clock signal CLK1 and the next gate output Gout(j+1) are low and a voltage at the contact J2 is also low, and thereby the transistors T10, T9, T12, T13, T8, and T2, which have the gates connected thereto, are turned off.

Subsequently, when the clock signal CLK2 becomes low, the transistors T11 and T5 are turned off, and when the clock signal CLK1 simultaneously becomes high, an output voltage of the transistor T1 and a voltage at the contact J2 are the high voltage. In this case, though the high voltage is applied to the gate of the transistor T10, since the source voltage thereof connected to the contact J2 is also the high voltage, a voltage difference becomes 0 and thereby the transistor T10 remains turned off. Accordingly, the contact J1 is in a floating state and a voltage of the contact J1 rises by as much as the high voltage by the capacitor C3.

Alternatively, when the clock signal CLK1 and the contact J2 are the high voltage, the transistors T12, T13, and T8 are turned off. Therefore, the transistor T12 and the transistor T13 are connected in series between the high and the low voltages, and thus a voltage at the contact J3 becomes a voltage value divided by resistances in ohmic states at the turned-on time of two transistors T12 and T13. In this case, when the resistance in the ohmic state at the turned-on time of the transistor T13 is set to be much larger, e.g., 10,000 times than that of the transistor T12, a voltage at the contact J3 is substantially similar to the high voltage. Accordingly, the transistor T7 is turned on to be connected in series with the transistor T8, and thereby a voltage at the contact J4 becomes a voltage value divided by the resistances in ohmic states at turned-on time of two transistors T7 and T8. In this case, when the resistances in the ohmic state at the turned-on time of two transistors T7 and T8 are substantially set to be similar to each other, the voltage at the contact J4 becomes approximately the average of the high and the low voltages. Since the next gate output Gout(j+1) still remains low, the transistors T9 and T2 are turned off. Accordingly, the output terminals OUT1 and OUT2 are only connected to the clock signal CLK1, and are disconnected from the low voltage to output the high voltage.

Additionally, the capacitors C1 and C2 charge to voltages corresponding to voltage differences developed at both terminals thereof, and a voltage at the contact J3 is lower than that of a contact J5.

Continuing with reference to FIG. 4, when the next gate output Gout(j+1) and the clock signal CLK2 become low and the clock signal CLK1 becomes high, the transistors T9 and T2 are turned on and transmit the low voltage to the contacts J1 and J2. At this time, a voltage at the contact J1 decreases to the low voltage while the capacitor C3 discharges. A certain amount of time is needed until the capacitor C3 discharges and the voltage at the contact J1 becomes the low voltage. Accordingly, two transistors T1 and T14 are turned on for a while after the next gate output Gout(j+1) becomes high, and thereby the output terminals OUT1 and OUT2 are connected to the clock signal CLK1 to output the low voltage. When the voltage at the contact J1 reaches the low voltage due to complete discharge of the capacitor C3, the transistor T14 is turned off disconnecting the output terminal OUT2 from the clock signal CLK1 and the carry output Cout(j) is in a floating state and remains low. At the same time, the output terminal OUT1 is connected to the low voltage via the transistor T2 irrespective of the turned-off state of the transistor T1 and the low voltage is outputted.

When the transistors T12 and T13 are turned off the contact J3 is in a floating state. Since a voltage at the contact J5 is lower than that at the contact J4 and the voltage at the contact J3 remains lower than that at the contact J5 by the capacitor C1, the transistor T7 is turned off. At the same time, the transistor T8 is turned off and the voltage at the contact J4 decreases, and thereby the transistor T3 remains turned off. Additionally, the transistor T10 is connected to the low voltage of the gate clock signal CLK1 and the voltage at the contact J2 is low, and thus the transistor T10 remains turned off. Since the transistors T12 and T7 are turned on due to the high voltage of the clock signal CLK1 and thus increase of the voltage at the contact J4 turns on the transistor T3, which transmits the low voltage to the contact J2, the output terminal OUT1 outputs the low voltage continuously. Even though the next gate output Gout(j+1) is low, the voltage at the contact J2 is made to be the low voltage.

Additionally, the gate of the transistor T10 is connected to the high voltage of the clock signal CLK1 and the voltage at the contact J2 is the low voltage, and thus the transistor T10 is turned on and transmits the voltage at the contact J2 to the contact J1. On the other hand, the drains of two transistors T1 and T14 are connected to the clock terminal CK1 to be continuously applied with the clock signal CLK1. In a particular exemplary embodiment, the transistor T1 is formed larger relative to the remaining transistors, and thereby a parasitic capacitance between the gate and the drain thereof is so large that a voltage variation of the drain may affect a gate voltage. Accordingly, an increase of the gate voltage due to the parasitic capacitance between the gate and the drain of the transistor T1 on the high voltage of the clock signal CLK1 turns on the transistor T1. In this case, it prevents the transistor T1 from turning on such that the gate voltage of the transistor T1 maintains the low voltage by transmitting the low voltage at the contact J2 to the contact J1. The voltage at the contact J1 maintains the low voltage until the previous carry output Cout(j−1) becomes high, and the voltage at the contact J2 is the low voltage via the transistor T3. This is the case when the clock signal CLK1 is high and the clock signal CLK2 is low and the voltage at the contact J2 is the low voltage via the transistor T5 when the clock signal CLK1 is low and the clock signal CLK2 is high.

In addition, the transistor T6 is supplied with the initializing signal INT outputted from the last dummy stage (not shown) to transmit the gate-off voltage $V_{off}$ to the contact J1, thereby setting the voltage at the contact J1 to be the low voltage once more.

Through the above described process, each stage 410 generates the carry signal Cout(j) and the gate output Gout(j) synchronized with the clock signals CLK1 and CLK2 in response to the previous carry signal Cout(j−1) and the next gate output Gout(j+1). It is also contemplated that various alternative configurations of transistors could accomplish the same results as the configuration shown in FIG. 4 which merely represents an exemplary embodiment of the stage 410.

In an alternative exemplary embodiment, the gate driver 400 may be integrated on the edge of the panel assembly 300, which will now be described in detail with reference to FIGS. 6-9.

Figure 7:
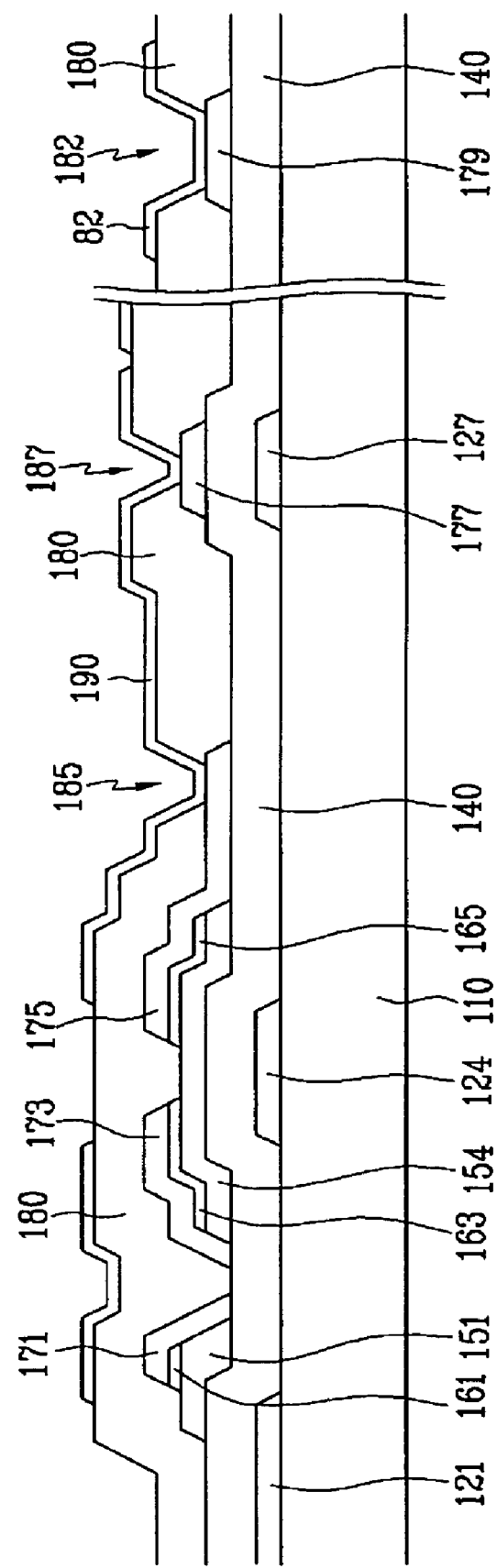
FIG. 7 is a sectional view of the thin film transistor array panel taken along the line VII-VII' in FIG. 6.
Figure 8A:
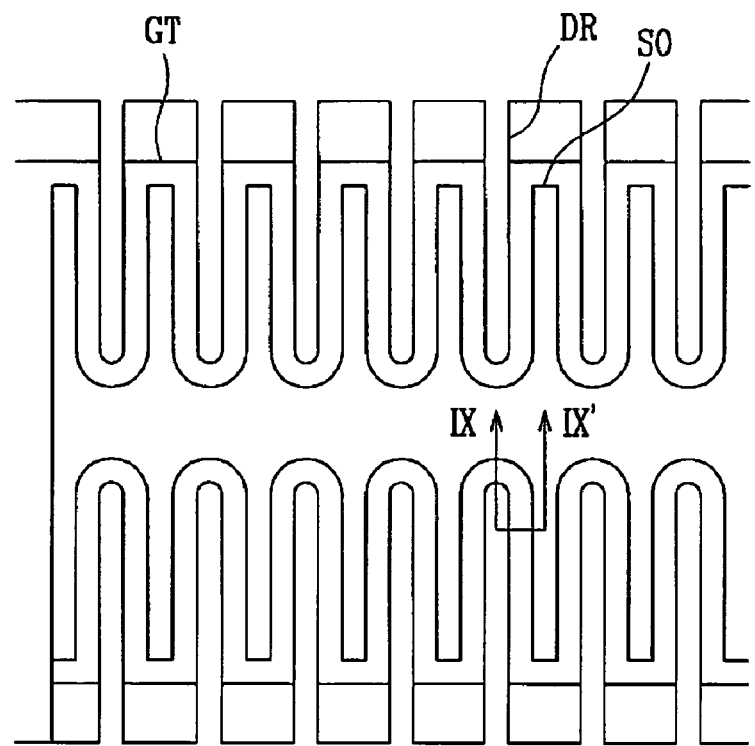
FIGS. 8A and 8B are schematic views of the transistor shown in FIG. 4.
Figure 8B:
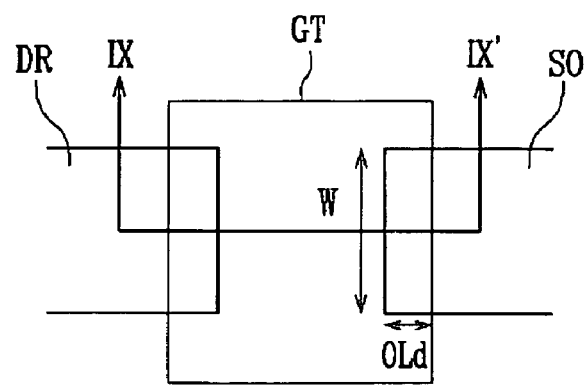
Figure 9:
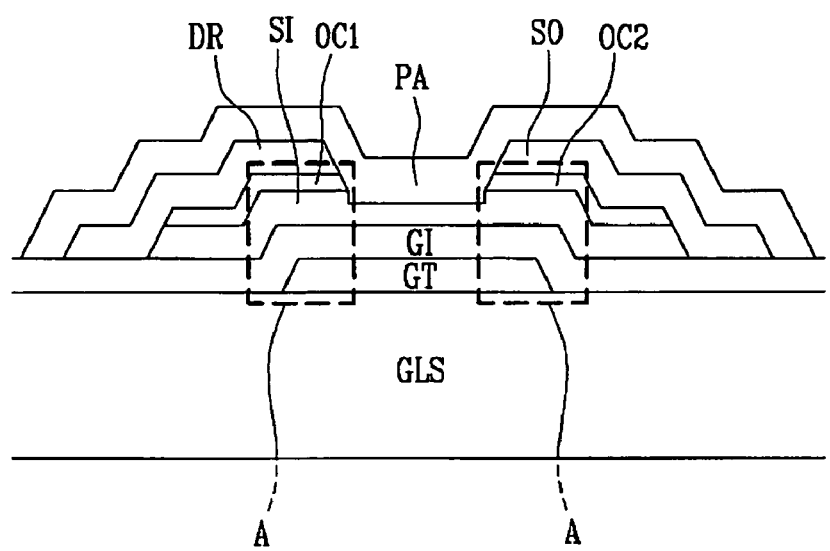
FIG. 9 is a sectional view of the transistor taken along the line IX-IX' in FIGS. 8A and 8B.

FIG. 6 is a layout view of an exemplary embodiment of a pixel of a thin film transistor array panel for a display device, and FIG. 7 is a sectional view of the thin film transistor array panel taken along the line VII-VII' in FIG. 6. FIGS. 8A and 8B are examples to illustrate exemplary structures of the transistors of the stage of the gate driver shown in FIG. 4, and FIG. 9 is a sectional view of the transistor taken along the line IX-IX' in FIGS. 8A and 8B.

Referring to FIGS. 6-9, a plurality of gate lines 121 and a plurality of gate electrodes GT are formed on an insulating substrate 110 and GLS. The gate lines 121 extend substantially in a transverse direction toward the gate driver 400 to transmit gate signals. A portion of each gate line 121 forms a gate electrode 124 and another portion thereof forms a projection 127 projecting downward. Each gate line 121 further includes an end portion (not shown) for contacting another layer or a driving circuit.

The gate lines 121 and the gate electrodes GT are made of materials including, but not limited to, an Al-containing metal such as Al and an Al alloy, an Ag-containing metal such as Ag and an Ag alloy, a Cu-containing metal such as Cu and a Cu alloy, a Mo-containing metal such as Mo and a Mo alloy, Cr, Ti, or Ta. The gate lines 121 may have a multi-layered structure including two films having different physical characteristics. One of the two films may be made of a low resistivity metal including, but not limited to, an Al-containing metal, an Ag-containing metal, and a Cu-containing metal for reducing signal delay or voltage drop in the gate lines 121 and the gate electrode GT. The other film may be made of a material including, but not limited to, a Mo-containing metal, Cr, Ta, or Ti, which have good physical, chemical, and electrical contact characteristics with other materials such as indium tin oxide (ITO) and indium zinc oxide (IZO). Examples of combinations of the two films are a lower Cr film and an upper Al (alloy) film, and a lower Al (alloy) film and an upper Mo (alloy) film. However, it is also contemplated that the two films may be made of various metals or conductors.

In an exemplary embodiment, the lateral sides of the gate lines 121 and the gate electrodes GT are inclined relative to a surface of the substrate creating inclination angles. The inclination angles range from about 20 degrees to about 80 degrees. Gate insulating layers 140 and GI may be made of a silicon nitride (SiNx) and are formed on the gate lines 121 and the gate electrode GT. Semiconductor stripes 151 and semiconductor islands SI may be made of a hydrogenated amorphous silicon (a-Si) and are formed on the gate insulating layers 140 and GI. Each semiconductor stripe 151 extends substantially in the longitudinal direction and has a plurality of projections 154 branched out toward the gate electrodes 124. The semiconductor islands SI are located on the gate electrodes GT.

A plurality of ohmic contact stripes and islands 161, 165, OC1, and OC2 may be made of a silicide or an n+ hydrogenated a-Si heavily doped with N-type impurities such as phosphorous. The ohmic contact strips and islands 161, 165, OC1, and OC2 may be formed on the semiconductor stripes 151 and the semiconductor islands SI. Each ohmic contact stripe 161 includes a plurality of projections 163, and the projections 163 and the ohmic contact islands 165 may be located in pairs on the projections 154 of the semiconductor stripes 151. Additionally, the ohmic contact islands OC1 and OC2 are located in pairs on the semiconductor islands SI.

The lateral sides of the semiconductor stripes 151, the semiconductor islands SI, the ohmic contact stripes 161 and 165, and the ohmic contact islands OC1 and OC2 are inclined relative to a surface of the substrate, and the inclination angles thereof range from about 30 degrees to about 80 degrees. A plurality of data lines 171, a plurality of output electrodes 175, a plurality of storage capacitor conductors 177, a plurality of drain electrodes DR, and a plurality of source electrodes SO are formed on the ohmic contacts 161, 165, OC1, and OC2 and the gate insulating layers 140 and GI.

The data lines 171 extend substantially in the longitudinal direction to transmit data voltages and intersect the gate lines 121. Each data line 171 includes a plurality of input electrodes 173 projecting toward the output electrodes 175. Each pair of input and output electrodes 173 and 175 is separated and disposed opposite each other with respect to a gate line 124. Additionally, the drain and source electrodes DR and SO are also separated and disposed opposite each other with respect to the gate electrode GT.

In the transistor shown in FIG. 8A, a plurality of branches extend like a comb in the longitudinal direction to form the drain electrodes DR, and a plurality of branches are interposed between the drain electrodes DR to form the source electrodes SO. In the transistor shown in FIG. 8B, each of branches like a large plate forms the drain electrode DR and the source electrode SO.

The control electrode 124, the input electrode 173, and the output electrode 175 along with the projection 154 of the semiconductor stripe 151 form a TFT having a channel formed in the projection 154 disposed between the input electrode 173 and the output electrode 175. Likewise, the gate electrodes GT, the drain electrodes DR, and the source electrodes SO, along with the semiconductor islands form TFTs, which are the transistors T1-T14 of the gate driver 400, having channels formed in the semiconductor islands SI between the drain electrodes DR and the source electrodes SO. In the transistor shown in FIG. 8A, the source electrodes SO and the drain electrodes DR are disposed alternately and thus the channels formed therebetween is shaped as a U.

The source electrodes SO overlap the gate electrodes GT interposing the gate insulating layers GI to form a component of the capacitor C3 of the gate driver 400. Additionally, the storage capacitor conductors 177 overlap the projections 127 of the gate lines 121.

The data lines 171, the output electrodes 175, the storage capacitor conductors 177, the drain electrodes DR, and the source electrodes SO may be made of a refractory metal including, but not limited to, Cr, Mo, Ti, Ta, or alloys thereof. Additionally, they may have a multi-layered structure including a low-resistivity film (not shown) and a good-contact film (not shown). Examples of the multi-layered structure are a double-layered structure including a lower Cr film and an upper Al (alloy) film, a double-layered structure of a lower Mo (alloy) film and an upper Al (alloy) film, and a triple-layered structure of a lower Mo film, an intermediate Al film, and an upper Mo film. However, it is also contemplated that the data lines 171, the output electrodes 175, the storage capacitor conductors 177, the drain electrodes DR, and the source electrodes SO may be made of various other suitable materials.

In an exemplary embodiment, the data lines 171, the output electrodes 175, the storage capacitor conductors 177, the drain electrodes DR, and the source electrodes SO have inclined edge profiles, and the inclination angles thereof range from about 30 degrees to about 80 degrees. The ohmic contacts 161, 165, OC1, and OC2 are interposed between the underlying semiconductor 151 and SI and the overlying conductors 171 and 175 thereon, and the drain electrodes DR and the source electrodes SO and the ohmic contacts 161, 165, OC1, and OC2 may be used to reduce the contact resistance.

Passivation layers 180 and PA are formed on the data lines 171, the output electrodes 175, the storage capacitor conductors 177, the drain electrodes DR, the source electrodes SO, and the exposed portions of the semiconductors 151 and SI. The passivation layer 180 may be made of an inorganic insulator including, but not limited to, silicon nitride or silicon oxide, a photosensitive organic material having a good flatness characteristic, or a low dielectric insulating material that has a dielectric constant lower than 4.0 such as a-Si:C:O and a-Si:O:F formed by plasma enhanced chemical vapor deposition (PECVD). The passivation layer 180 may have a double-layered structure including a lower inorganic film and an upper organic film so that it may take advantage of the organic film and it may protect the exposed portions of the semiconductor stripes 151. The passivation layer 180 has a plurality of contact holes 182, 185, and 187 exposing the end portions 179 of the data lines 171, the output electrodes 175, and a portion thereof, respectively.

A plurality of pixel electrodes 190 and a plurality of contact assistants 82, which may be made of a transparent conductor including, but not limited to, ITO or IZO or a reflective conductor such as Ag or Al, are formed on the passivation layer 180.

The pixel electrodes 190 are physically and electrically connected to the output electrodes 175 and the storage capacitor conductors 177 through the contact holes 185 and

187 such that the pixel electrodes 190 receive the data voltages from the output electrodes 175. The pixel electrodes 190 are supplied with the data voltages to generate electric fields in cooperation with the common electrode 270, which is supplied with the common voltage. The generated electric field determines the orientations of liquid crystal molecules in the liquid crystal layer 3.

As described above with reference to FIG. 2, the pixel electrode 190 and the common electrode 270 form a liquid crystal capacitor $C_{LC}$, which stores applied voltages after turn-off of the TFT. The storage capacitor $C_{ST}$ enhances the voltage storing capacity and is implemented by overlapping the pixel electrode 190 with a previous gate line 121. The capacitances of the storage capacitors $C_{ST}$ are increased by providing the projections 127 at the gate lines 121 for increasing overlapping areas. Additionally, the capacitances of the storage capacitors $C_{ST}$ may be increased by providing the storage capacitor conductors 177, which are connected to the pixel electrodes 190 and overlap the projections 127, under the passivation layer 180 for decreasing the distance between the terminals. In an alternative exemplary embodiment, the pixel electrodes 190 overlap the gate lines 121 and the data lines 171 to increase the aperture ratio.

The contact assistants 82 are connected to the exposed end portions 179 of the data lines 171 through the contact holes 182. The contact assistants 82 protect the exposed end portions 179 and complement the adhesion between the end portions 179 and external devices.

The pixel electrodes 190 may be made of a transparent conductive polymer. For a reflective LCD, the pixel electrodes 190 may be made of an opaque reflective metal. In these cases, the contact assistants 82 may be made of a material different from the pixel electrodes 190 including, but not limited to, ITO or IZO.

Turning now to FIGS. 10-15, an exemplary embodiment of a driving circuit of a display device according to an exemplary embodiment of the present invention will be described in detail.

Figure 10:
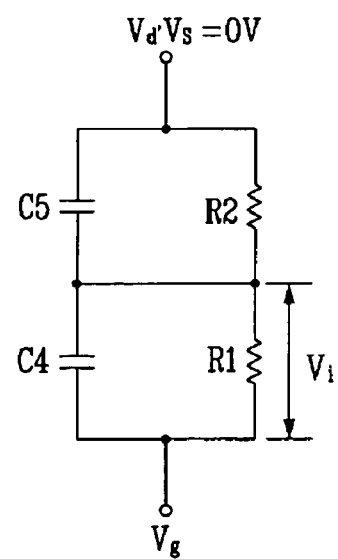
FIG. 10 is an equivalent view of area A of the transistor shown in FIG. 9.

FIG. 10 illustrates an equivalent circuit diagram of a region A in the sectional view of the transistor shown in FIG. 9, and is an equivalent circuit diagram when the ohmic contacts OC1 and OC2 are not formed.

A portion of the gate electrode GT, the gate insulating layer GI, and the semiconductor layer SI overlap with each other as shown in FIG. 9. The gate electrode GT and the semiconductor SI overlap, interposing the gate insulating layer GI, to form a capacitor C4, and the gate insulating layer GI and the drain electrode DR or the source electrode SO overlap interposing the semiconductor SI to form a capacitor C5. Additionally, the gate insulating layer GI and the semiconductor layer SI have resistivity, symbols of which are represented as "R1" and "R2", respectively. The area A shares the gate insulating layer GI, and is shown as an equivalent circuit formed in parallel between the gate electrode GI and the source electrode SO or the drain electrode DR.

A voltage applied to the gate electrode GT is referred to as a gate voltage Vg and a voltage applied to the drain electrode DR or the source electrode SO is assumed to be about 0V for calculative convenience, and a voltage Vi applied over the gate insulating layer GI is represented as Equation 1;

$$V_i(t) = V_g \left[ 1 - \frac{C_i}{C_{Si} + C_i} \exp\left(-\frac{t}{\tau}\right) \right], \tau = (C_{Si} + C_i)\left(\frac{1}{R_{Si}} + \frac{1}{R_i}\right)^{-1} \quad (1)$$

where Csi and Ci represent capacitances of two capacitors C4 and C5, Rsi and Ri represent resistances of the resistors R1 and R2, respectively, and τ represents a time constant.

The voltage Vi over the gate insulating layer GI is a function of time, the voltage Vg developed over two capacitors C4 and C5 is divided, a voltage value developed over the capacitor C4 is defined as an initial value Vi(0), and a voltage value developed over the capacitor C5 is defined as a final value Vi(∞), and thereby the voltage Vi is obtained. Additionally, the time constant τ is a multiplication of an equivalent resistance and an equivalent capacitance. The equivalent capacitance is obtained by adding two capacitances and the equivalent resistance is obtained by making a reciprocal of sum of a reciprocal of each of the resistances.

Meanwhile, the capacitances Csi and Ci and the resistances Rsi and Ri are represented as Equation 2.

$$C_{Si,i} = \frac{\varepsilon_{Si,i}}{t_{Si,i}} \cdot W \cdot OL_d, \quad R_{Si,i} = \frac{\rho_{Si,i} \cdot t_{Si,i}}{W \cdot OL_d} \quad (2)$$

where Xsi,i represents Xsi and Xi together, εsi,i and tsi,i represent dielectrics and thicknesses of the semiconductor layer SI and the gate insulating layer GI. Additionally, ρsi,i represents resistivity of the semiconductor layer SI and the gate insulating layer GI, W represents a width of the channel and OLd represents an overlap length of the area A.

In this case, a coefficient [Ci/(Csi+Ci)] in the exponential function and the time constant τ in Equations 1 and 2 are represented as the thicknesses and the dielectric ratios of the semiconductor layer SI to the gate insulating layer GI in Equations 3 and 4 as follows.

$$\frac{C_i}{C_{Si} + C_i} = \frac{\left(\frac{t_{Si}}{t_i}\right)}{\left(\frac{\varepsilon_{Si}}{\varepsilon_i}\right) + \left(\frac{t_{Si}}{t_i}\right)} \quad (3)$$

$$\tau = \varepsilon_{Si}\rho_{Si} \cdot \frac{1}{\left(\frac{t_{Si}}{t_i}\right)} \cdot \frac{\left(\frac{\varepsilon_{Si}}{\varepsilon_i}\right) + \left(\frac{t_{Si}}{t_i}\right)}{1 + \left(\frac{\rho_{Si}}{\rho_i}\right) \cdot \left(\frac{t_{Si}}{t_i}\right)} \quad (4)$$

In Equation 4, the resistivity ρsi varies in inverse proportion to temperature and thus the time constant τ has a value dependent on the temperature.

In Equation 1 both sides are divided by the gate voltage Vg corresponding to an input voltage, and thus the left side is a function corresponding to a voltage gain. A function of the voltage gain is referred to as "F(VG)" and the coefficient of the exponential function in Equation 3 is referred to as "$E_1$", and the remaining except for the resistivity ρsi in Equation 4 are referred to as "$E_2$" gives $$F(VG) = 1 - E_1 \exp\left(-\frac{t}{\tau}\right), \tau = \rho_{si} \cdot E_2 \qquad (5)$$

where the $E_1$ and $E_2$ are constants or variables.

Turning now to FIG. 11, a table is used to illustrate several voltage characteristics of the transistors T1-T14 shown in FIG. 4. and the switching elements Q. The transistors T1-T14 and Q are shown in the first column, and the high voltage and the low voltage are shown in the second column. The drain voltages are shown in the third column, the voltage differences between the gate and the drain are shown in the fourth column, high voltage ratios for a frame are shown in the fifth column, and amounts of the variation of the threshold voltage are shown in the last column.

The high voltage is the maximum voltage of the gate voltages Vg. The high voltage ratios for a frame are how long the high voltages are applied to the gates of the transistors for a frame. For example, in the transistor T5, as shown in FIG. 4, the gate of the transistor T5 is connected to the clock signal CLK2, which has a duty ratio of 50%, and thus the gate thereof is connected to the clock signal CLK2 for a half period of a frame. Accordingly, the high voltage ratio is 0.5.

Additionally, the variation amount of the threshold voltage in each of the transistors T1-T14 on being operated for 2000 hours at a high temperature such as 60 degrees or over has volts V as a unit. In this case, the transistors T3, T5, T10, and T11 are relatively large and more than a 10V variation amount of the threshold voltage contributes to an error in the operation of the stage 410. As described above, such threshold voltage has a tendency to increase in proportion to the voltage Vi over the gate insulating layer GI, and thus the voltage Vi over the gate insulating layer GI is preferably decreased.

Figure 12A:
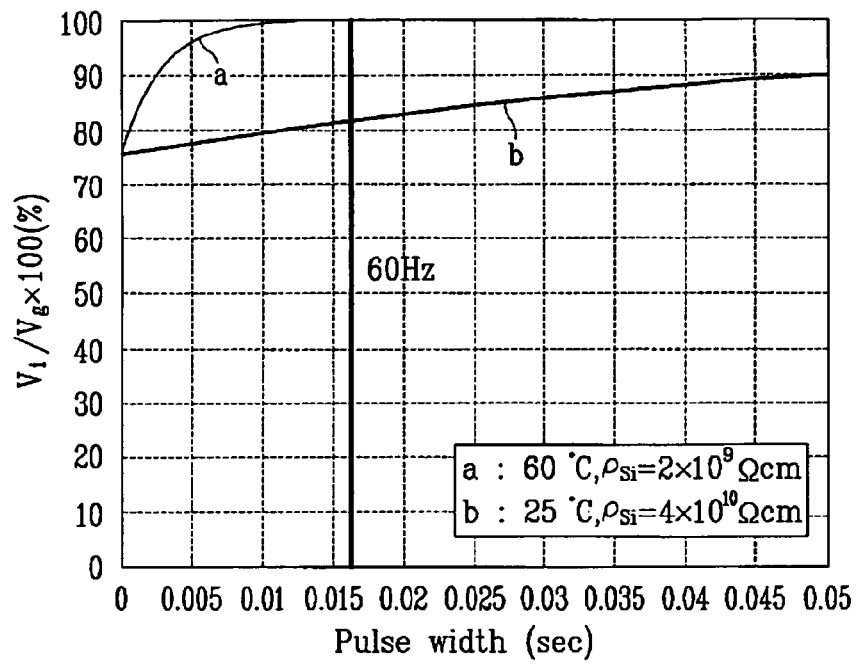
FIG. 12A is a graph that illustrates the relation of a voltage gain and a pulse width as parameters of temperature.

Turning now to FIGS. 12A-13B, graphs representing the voltages gain as functions of pulse widths or thickness ratios are used as references to explain the exemplary embodiments of the present invention. FIGS. 12A and 12B use temperatures, FIG. 13A uses a pulse width, and FIG. 13B uses a dielectric ratio, as parameters. Additionally, the longitudinal axis represents the voltage gain shown as a percentage (%), and the temperature is divided into two conditions such as 25 degrees and 60 degrees. The 25 degrees condition corresponds to room temperature, and the 60 degrees condition corresponds to temperature increase due to operation of the display device. The pulse width is a width of a high interval of the gate voltage, and the dielectric ratio and the thickness ratio of the semiconductor layer SI to the insulating layer GI, respectively, are εsi/εi and tsi/ti.

Referring to FIG. 12A, when the resistivity ρsi of the semiconductor layer SI is $4 \times 10^{10}$ Ωm at 25 degrees and the resistivity ρsi of the semiconductor layer SI is $2 \times 10^9$ Ωm at 60 degrees, the time constant τ is a constant for each temperature and furthermore E1 and E2 are constants for constant dielectric ratio and thickness ratio. In this case, variation of the pulse width corresponding to time gives the graphs a and b at each of the temperatures. The time constant at 60 degrees is about 20 times less than at 25 degrees, and thus the graph at 60 degrees reaches 100% faster. In other words, the voltage Vi over the gate insulating layer GI reaches the gate voltage Vg faster at 60 degrees. A frame frequency of 60 Hz as shown in FIG. 12A is converted into a period of 0.016 seconds as a time. It is shown that the voltage Vi reaches the gate voltage Vg faster than the time at 60 degrees than at 25 degrees.

Figure 12B:
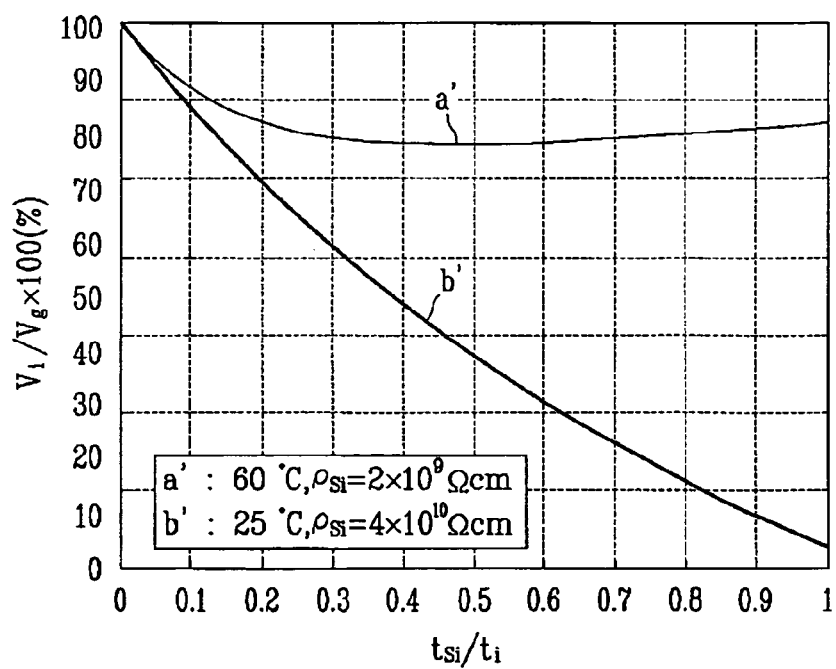
FIG. 12B is a graph that illustrates the relation of a voltage gain and a thickness ratio as parameters of temperature.

Referring to FIG. 12B, the resistivity ρsi is identical to that in FIG. 12A, but since E1 and E2 include the thickness ratios, they are not a constant but rather functions of the thickness ratios, and the time constant is not a constant but a function of the thickness ratio as well. In this case, the pulse width, i.e., t in Equation 5, is defined as 0.01, and variation of the thickness ratio gives graphs at two temperatures. The graph b' at 25 degrees decreases regularly, but the graph a' at 60 degrees decreases to some extent and increases again.

Figure 13A:
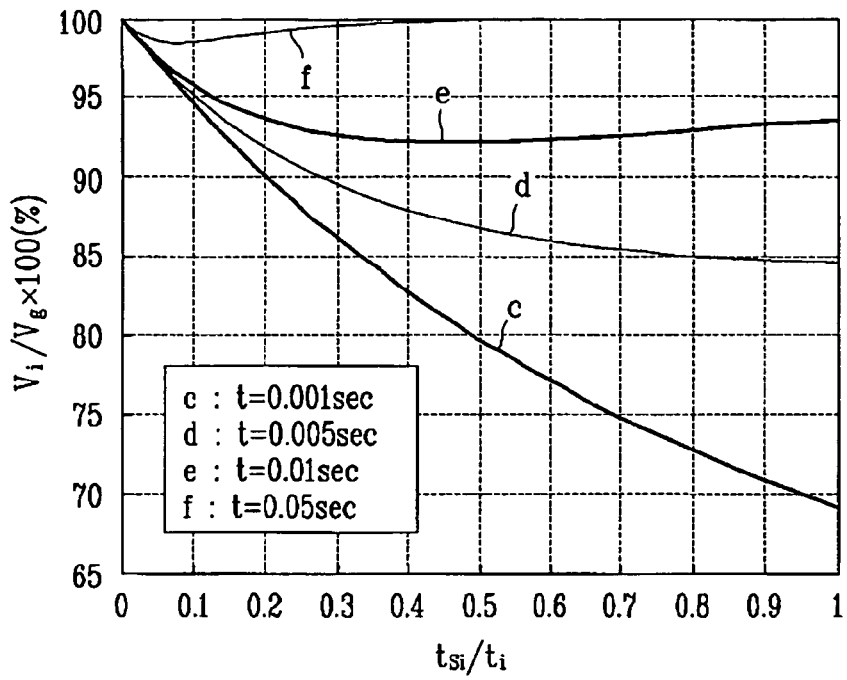
FIG. 13A is a graph that illustrates the relation of a voltage gain and a thickness ratio as parameters of a pulse width.

Referring to FIG. 13A, four curves c, d, e, and f that are dependent on the pulse widths are shown. The four curves c, d, e, and f are graphs when the pulse widths are 0.001 seconds, 0.005 seconds, 0.01 seconds, and 0.05 seconds, respectively. As described above, a pulse width is not larger than a time for a frame and thus the curve f is negligible. The curve c decreases regularly, the curve d decreases to some extent and maintains a constant value, and the curve e decreases regularly and increases again, dependent on an increase of the thickness ratio.

The curve c shows the smallest pulse width of 0.001 seconds, but the pulse width is even smaller than that. For example, when the number of gate lines is 100, 0.016 seconds. Corresponding to a frame divided by 100 becomes 1H, which is a pulse width smaller than the smallest pulse width of the curve c. However, since the gate voltage Vg corresponds to 2H or less, at most as described in FIG. 4, and thus the pulse width is even smaller than 0.001 seconds. Accordingly, a graph at a pulse width smaller than 0.001 second may be formed below the curve c.

Figure 13B:
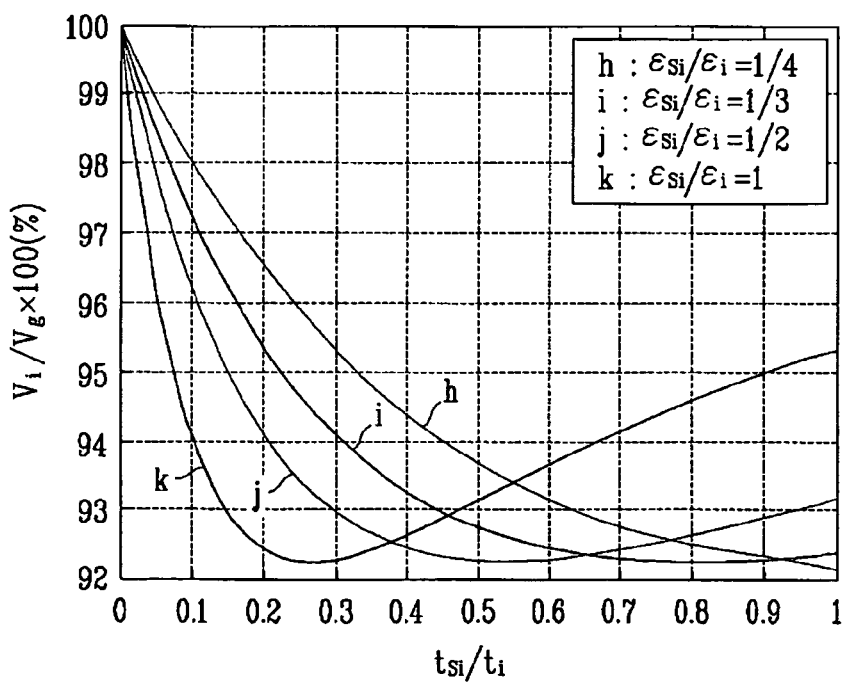
FIG. 13B is a graph that illustrates the relation of a voltage gain and a thickness ratio as parameters of a dielectric ratio.

Referring to FIG. 13B, curves h, i, j, and k are shown dependent on the dielectric ratios, and the curves h, i, j, and k represent variations dependent on the thickness ratios when the dielectric ratios are ¼ to 1, and a time is 0.01 seconds. The thickness ratio ranges from 0.3 to 1.5. In this case, the semiconductor layer SI is too thin to form a channel in a thickness smaller than 0.3, but on the contrary, in a thickness larger than 1.5, a photosensitivity of the gate insulating layer GI increases to enlarge a leakage current and further the gate insulating layer GI is so thin as to be destroyed.

The curve h decreases continuously passing the thickness ratio of 1, the curve i decreases to the thickness ratio of 0.8 and then increases smoothly, the curve j decreases to the thickness ratio of 0.5 and then increases smoothly, and the curve k decreases to the thickness ratio between 0.2 and 0.3 and then increases. In this case, the dielectric ratio is preferably smaller than 1 in a thickness ratio range of 0.3 to 1.5. When the dielectric ratio is larger than 1, the voltage gain increases continuously in a thickness ratio range of 0.3 to 1.5, and as a result the voltage Vi increases.

As known in those skilled in the art, a material dielectric may be varied within a predetermined range through gas treatment such as plasma, hydrogen, helium, and so on.

Figure 14A:
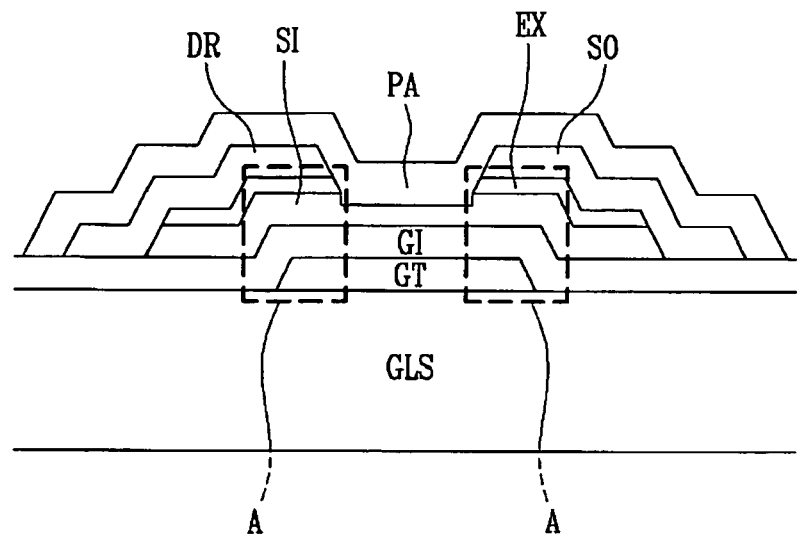
FIG. 14A is a sectional view of another exemplary embodiment of a transistor of a driving circuit for a display device according to the present invention.
Figure 14B:
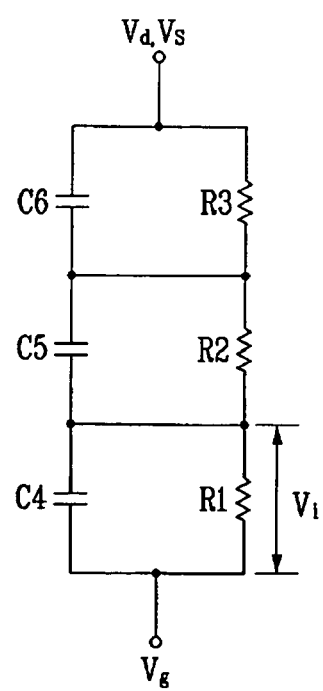
FIG. 14B is an exemplary equivalent view of area A of the transistor shown in FIG. 14A.
Figure 15A:
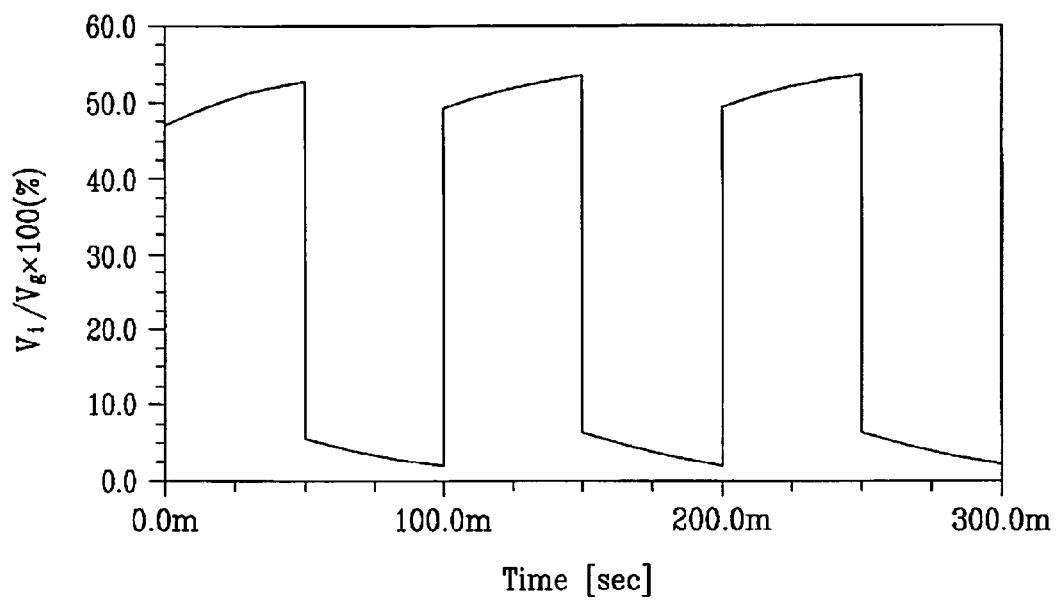
FIGS. 15A and 15B are graphs that illustrate curves of voltage gains to times according to dielectric ratios of ohmic contact layers to semiconductor layers.
Figure 15B:
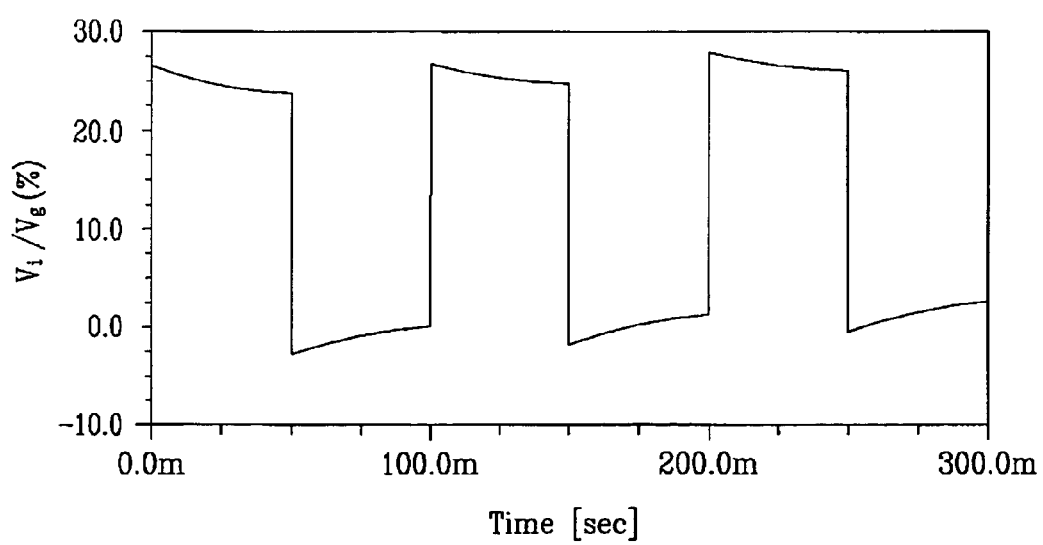

Turning now to FIGS. 14A-15B another exemplary embodiment will be described in further detail. FIG. 14A is a sectional view of an exemplary embodiment of a transistor for a driving circuit for a display device which shows the formation of ohmic contacts, FIG. 14B is an equivalent circuit of area A of the transistor shown in FIG. 14A, and FIGS. 15A and 15B are graphs to illustrate voltage gains to times in varying dielectric ratios.

FIGS. 14A and 14B are substantially similar to FIGS. 9 and 10, and thus explanation thereof will be omitted. However, a capacitor C6 and a resistor R3 by an ohmic contact EX are added in FIG. 14B. Then, the voltage Vi over the gate insulating layer GI are rewritten as follows.

$$Vi(t) = Vg\left[1 - \frac{C_i C_{si} + C_i C_{ex}}{C_i C_{si} + C_{si} C_{ex} + C_i C_{ex}} \exp\left(\frac{-t}{\tau}\right)\right], \quad (6)$$

$$t = (C_i + C_{si} + C_{ex})\left(\frac{1}{R_i} + \frac{1}{R_{si}} + \frac{1}{R_{ex}}\right)^{-1}$$

where Ci, Csi, and Cex are capacitances of the capacitors C4, C5, and C6, respectively, and Ri, Rsi, and Rex are resistances of the resistors R1, R2, and R3, respectively.

The resistance Ri and the capacitance Ci are set as $7.7 \times 10^{12} \Omega$ and 0.0079 pF, respectively, the resistance Rsi and the capacitance Csi of the semiconductor layer SI are set as $1.7 \times 10^{12} \Omega$ and 0.024 pF, respectively, and the resistance Rex of the ohmic contact EX is set as $1.7 \times 10^{12} \Omega$. At the same time, the capacitance Cex is set as 0.012 pF (the ratio Cex/Csi=0.5) and 0.24 pF (the ratio Cex/Csi=10) in FIG. 15A and FIG. 15B, respectively, and then SPICE simulations are performed. The longitudinal axis represents a voltage gain shown as a percentage and the transverse axis represents time. In this case, a simulation was performed defining a pulse width of the gate voltage Vg as 0.05 seconds, which exceeds a time for a frame. However, even though a simulation is performed at a time under 0.05 seconds, the pulse width is identical thereto.

As shown in FIGS. 15A and 15B, it is known that the voltage gains do not exceed 50%, and, as the capacitance ratios Cex/Csi increase, the voltage gains decrease.

The capacitance ratio Cex/Csi may be adjusted by the overlap area or thickness as known from Equation 2. However, adjustment of the thickness is performed in a range of the thickness ratio of the semiconductor SI to the gate insulating layer GI of 0.3 to 1.5.

As described above, the thickness ratio tsi/ti or the dielectric ratio εsi/εi of the semiconductor layer SI to the gate insulating layer GI is adjusted to reduce the voltage Vi over the gate insulating layer GI, thereby preventing the threshold voltage from increasing. Additionally, the capacitance ratio Cex/Csi of the ohmic contact EX to the semiconductor layer SI is adjusted to reduce the voltage Vi. Accordingly, a driving circuit for a display device having high reliability for a long driving time can be provided While the present invention has been described in detail with reference to the preferred embodiments, it is to be understood that the invention is not limited to the disclosed embodiments, but, on the contrary, is intended to cover various modifications and equivalent arrangements included within the sprit and scope of the appended claims.

What is claimed is:

1. A driving circuit for a display device, comprising a plurality of stages connected to each other and sequentially generating output signals,
   wherein each of the stages comprises a plurality of transistors,
   wherein each of the transistors comprises:
   a control electrode;
   a first insulating layer comprising a first material formed on the control electrode and having a capacitance Csi and a resistance Rsi;
   a semiconductor layer comprising a second material formed on the first insulating layer and having a capacitance Ci and a resistance Ri;
   an input electrode, at least a portion of which formed on the semiconductor layer;
   an output electrode, at least a portion of which formed on the semiconductor layer; and
   a second insulating layer formed on the input and output electrodes,
   wherein a thickness ratio of the semiconductor layer to the first insulating layer is in a range from 0.3 to 1.5,
   wherein the first material of the first insulating layer and the second material of the semiconductor layer are chosen such that a relation of a voltage Vi over the first insulating layer and a voltage Vg applied to the control electrode satisfies the equation $$V_i(t) = V_g\left[1 - \frac{C_i}{C_{Si} + C_i}\exp\left(-\frac{t}{\tau}\right)\right], \tau = (C_{Si} + C_i)\left(\frac{1}{R_{Si}} + \frac{1}{R_i}\right)^{-1},$$

where Csi and Rsi are the capacitance and the resistance of the semiconductor layer, respectively, Ci and Ri are the capacitance and the resistance of the first insulating layer, respectively, and τ is a time constant.

2. The driving circuit for the display device of claim 1, wherein a dielectric ratio of the semiconductor layer to the first insulating layer is smaller than 1.

3. The driving circuit for the display device of claim 2, wherein the voltage over the first insulating layer is smaller than the voltage applied to the control electrode.

4. The driving circuit for the display device of claim 3, wherein the semiconductor layer comprises amorphous silicon.

5. The driving circuit for the display device of claim 4, wherein a gate driver is integrated on the display device.

6. The driving circuit for the display device of claim 1, wherein each of the transistors further comprises an ohmic contact between the semiconductor layer and the input electrode.

7. The driving circuit for the display device of claim 6, wherein a capacitance ratio of the ohmic contact to the semiconductor layer is larger than 0.5.

8. The driving circuit for the display device of claim 1, wherein each of the transistors further comprises an ohmic contact comprising a third material between the semiconductor layer and the output electrode and having a capacitance Cex and a resistance Rex.

9. The driving circuit for the display device of claim 8, wherein a capacitance ratio of the ohmic contact to the semiconductor layer is larger than 0.5.

10. The driving circuit for the display device of claim 8, wherein the third material of the ohmic contact is chosen such that the relation of the voltage Vi over the firstinsulating layer and the voltage Vg applied to the control electrode further satisfies the equation $$Vi(t) = Vg\left[1 - \frac{C_i C_{si} + C_i C_{ex}}{C_i C_{si} + C_{si} C_{ex} + C_i C_{ex}} \exp\left(\frac{-t}{\tau}\right)\right],$$

$$\tau = (C_i + C_{si} + C_{ex})\left(\frac{1}{R_i} + \frac{1}{R_{Si}} + \frac{1}{R_{ex}}\right)^{-1},$$

where Ci and Ri are the capacitance and the resistance of the first insulating layer, respectively, Csi and Rsi are the capacitance and the resistance of the semiconductor layer, respectively, Cex and Rex are the capacitance and the resistance of the ohmic contact, respectively, and τ is a time constant.

11. The driving circuit for the display device of claim 10, wherein the voltage over the first insulating layer is smaller than the voltage applied to the control electrode.

* * * * *